United States Patent [19]
Bright et al.

[11] Patent Number: 5,729,559
[45] Date of Patent: Mar. 17, 1998

[54] METHOD AND APPARATUS FOR CORRECTING ERRORS USING MULTIPLE ESTIMATES

[75] Inventors: Michael W. Bright, Arlington Heights; Eric F. Ziolko, Schaumburg, both of Ill.

[73] Assignee: Motorola, Inc., Schaumburg, Ill.

[21] Appl. No.: 411,243

[22] Filed: Mar. 27, 1995

[51] Int. Cl.$^6$ .................................................. H03M 13/12
[52] U.S. Cl. .................................................. 371/43; 371/46
[58] Field of Search .................................. 371/43, 46, 37.9, 371/42

[56] References Cited

U.S. PATENT DOCUMENTS

| | | | |
|---|---|---|---|
| 3,227,999 | 1/1966 | Hagelbarger | 371/37.9 |
| 3,587,042 | 6/1971 | Mitchell | 371/37.9 |
| 3,639,901 | 2/1972 | Mitchell | 371/37.9 |
| 4,667,327 | 5/1987 | Bright et al. | 371/47 |
| 4,827,514 | 5/1989 | Ziolko et al. | 380/48 |

OTHER PUBLICATIONS

Clark, G., et al., "Error–Correction Coding for Digital Communications", Plenum Press, pp. 131–137, 283–297 Jan. 1981.

Lin, S., et al., "Error–Control Coding: Fundamentals and Applications", Prentice–Hall, pp. 184–256 Jan. 1983.

Primary Examiner—Stephen M. Baker
Attorney, Agent, or Firm—Susan L. Lukasik

[57] ABSTRACT

An apparatus for and method of correcting errors in a received signal comprised of a rate-one orthogonal convolutional code generated by an LFSR involved feeding (403) a received signal into a multiple-stage shift register (201). Estimates of one of the stages of the shift register are performed by estimators (203, 205, 207, 209, 211, 213, and 215) and are based on the outputs of several of the other stages of the shift register (201). These estimates are combined on a bit-by-bit basis to provide a corrected received signal, which is used as the output of the shift register (201).

20 Claims, 4 Drawing Sheets

-- PRIOR ART --

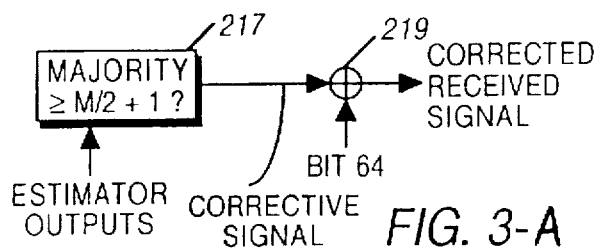
FIG. 3-A
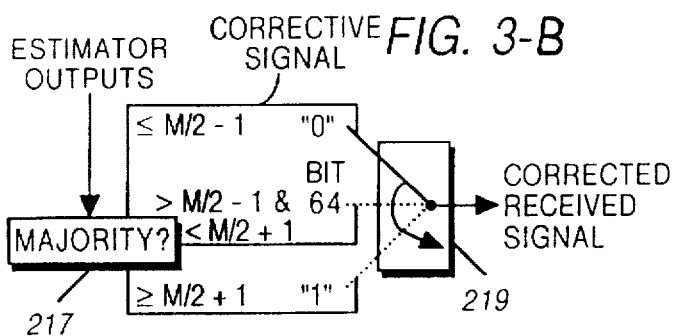
FIG. 3-B
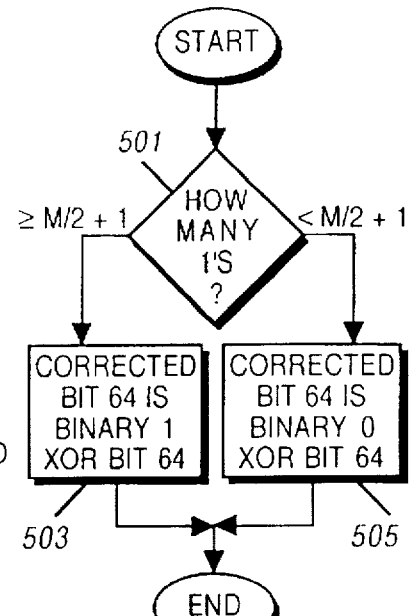
FIG. 5-A
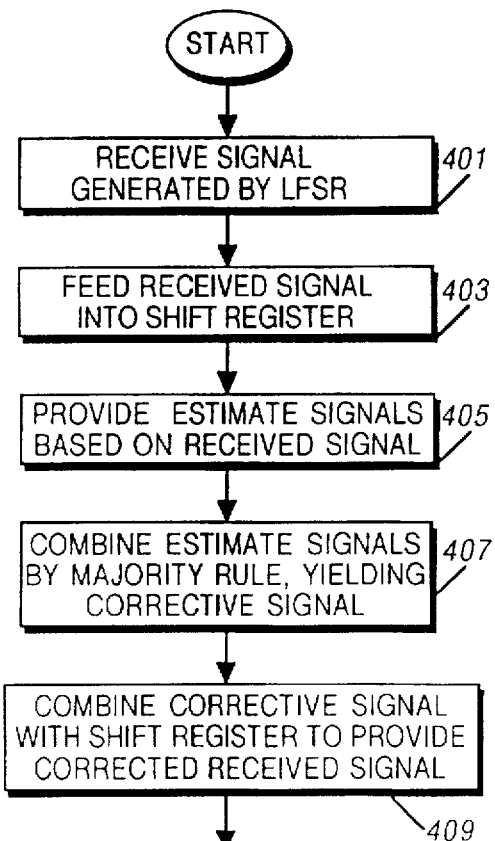
FIG. 4
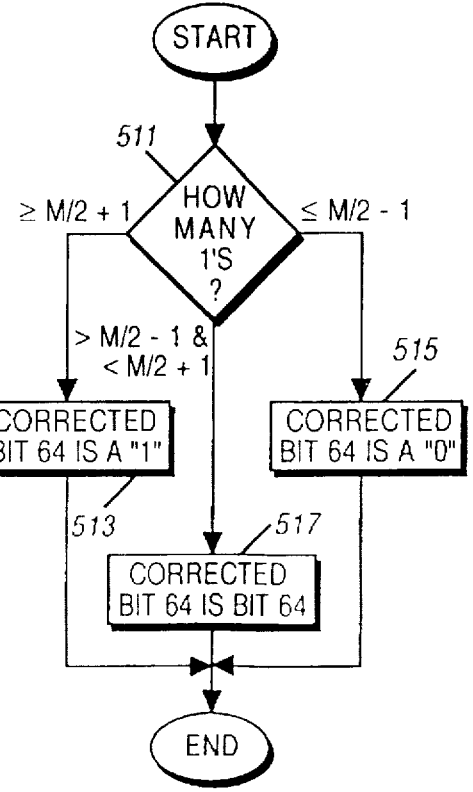
FIG. 5-B

METHOD AND APPARATUS FOR CORRECTING ERRORS USING MULTIPLE ESTIMATES

FIELD OF THE INVENTION

This invention relates to digital error correction, including, but not limited to, digital error correction on codes generated by a linear feedback shift register (LFSR).

BACKGROUND OF THE INVENTION

It is well known by those skilled in the art that in a synchronous data communication system, synchronization information must be continuously or periodically sent from the transmitter to the receiver to initiate and maintain synchronization (commonly referred to as sync). Loss of sync can result in total loss of the transmitted information. Accordingly, it is imperative that a reliable means be found to increase the probability of initiating and maintaining sync between a transmitter and one or more receivers.

A major problem in trying to synchronize a receiver to a transmitter is encountered when the sync information is corrupted by noise. Those skilled in the art will appreciate that a signal transmitted over a communication resource may become corrupted by noise due to physical disruptions in the communication resource, atmospheric disturbances, or simply background random noise. Therefore, given that the sync information may be corrupted by noise, and thus received in error, some communication systems attempt to correct the received information to facilitate sync.

Previous error correction techniques include parity bits interleaved between sync information bits or check word bits transmitted at the end of a sync bit sequence to attempt to correct errors at the receiver. Because parity bits and check word bits are redundant sync information bits, transmitting such bits reduces the sync information data rate because time is wasted sending this redundant information. Stated another way, the transmission of parity bits or check word bits requires additional bandwidth that may not be available in a crowded spectral environment.

A rate one orthogonal convolutional code utilizes a linear feedback shift register (LFSR) as the encoder. A standard convolutional coder inputs an information channel and outputs the information channel along with parity bits. The LFSR register can be considered as a particular type of convolutional code with the parity bit fed back as the information bit. Thus, the output of the LFSR coder consists only of the information channel. An orthogonal LFSR coder is used to provide independent estimates of error.

One method of correcting errors in a linear feedback shift register (LFSR) sequence is to form an error estimate and store the result in a syndrome register. A majority decoder, also referred to as a majority voter in the art, is used in conjunction with the syndrome register to correct bits in the LFSR sequence. Such a system is shown in FIG. 1. DATA IN is a signal that is input to an XOR gate 107 and an open-loop LFSR 101, comprised of a shift register 103 and a bank of XOR gates 105. The outputs of six stages, also known as taps, of the shift register 103 are the same six stages as those used in the LFSR that generated the DATA IN signal that was transmitted. The outputs of the six stages of the shift register 103 are input to the bank of XOR gates 105. The output of the bank of XOR gates 103 is input to the XOR gate 107. The output of XOR gate 107 is the error estimate, which is input to an input of an XOR gate 109 that has its output connected to an input of a syndrome register 111. There are also six taps from the syndrome register that are output to a majority decoder 113. The output of the XOR gate 107 is also input to the majority decoder 113. The majority decoder 113 then decides if the current bit being predicted needs correction and sends a syndrome correction bit signal 115 to make necessary corrections. The syndrome correction bit is also input to an XOR gate 117, which has its other input tied to the LFSR 101 output, i.e., bit 64 also known as stage 64. The output of this XOR gate 117 is input to a temporary register 119 which stores the corrected bits for use within the device. A clock signal is used to synchronize the flow of bits through the LFSR 101, the syndrome register 111, and the temporary register 119. More details about this LFSR correction method may be found in U.S. Pat. No. 4,667,327, issued on May 19, 1987 to Bright et al., with the same assignee as the present invention, which patent is hereby incorporated by reference. Although this method adequately corrects errors introduced by transmission of the LFSR sequence, such a method requires a large number of gates in its implementation.

Accordingly, there is a need for a reliable means of correcting LFSR sync information while minimizing hardware necessary to provide such correction.

BRIEF DESCRIPTION OF THE DRAWINGS

FIG. 3-A and FIG. 3-B are block diagrams of majority decoders in accordance with the invention.

FIG. 4 is a flowchart showing error correction of an LFSR sequence in accordance with the invention.

FIG. 5-A and FIG. 5-B are flowcharts showing majority decoding in accordance with the invention.

DESCRIPTION OF THE PREFERRED EMBODIMENT

Figure 1:
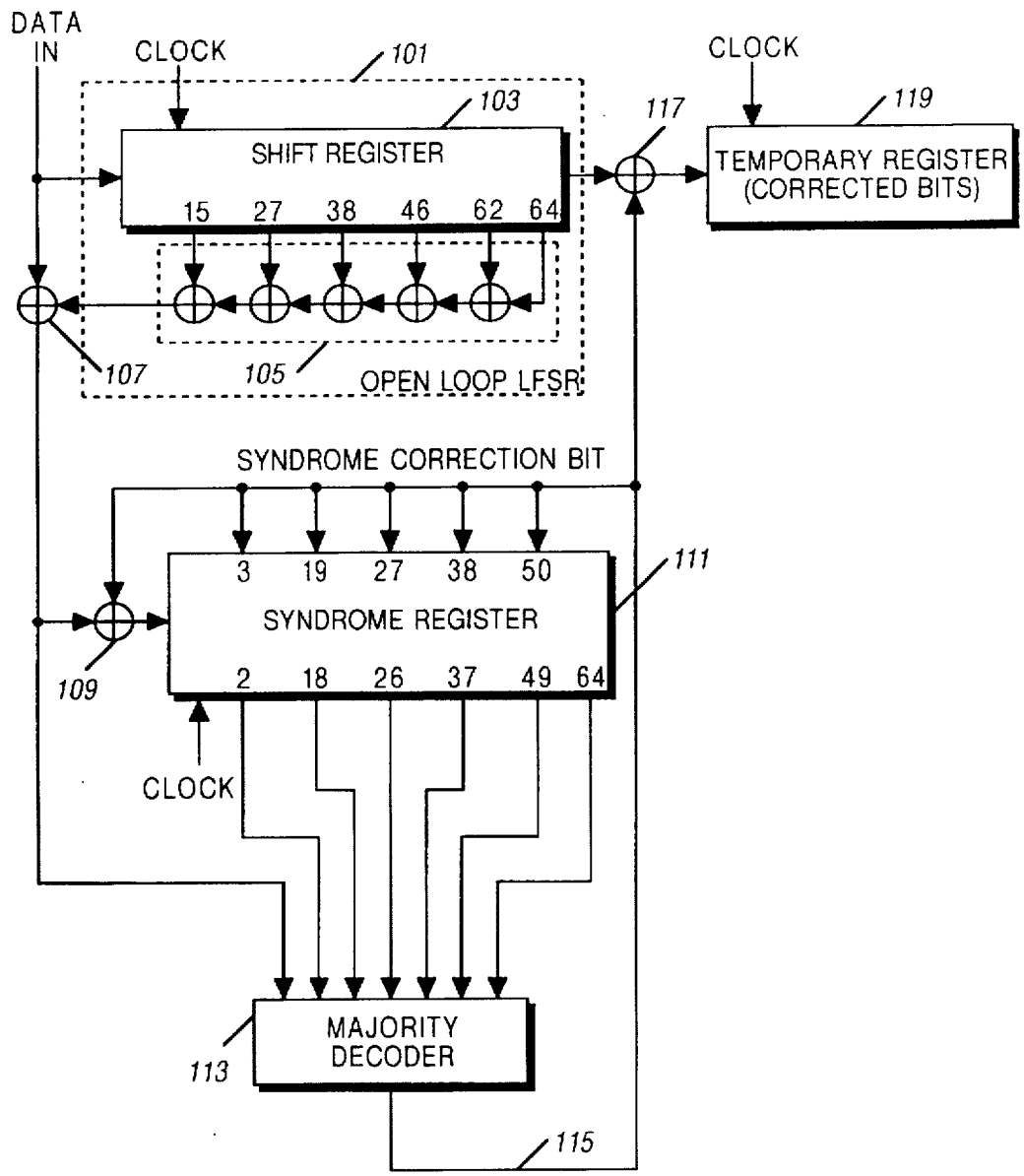
FIG. 1 is a block diagram of an open loop LFSR in conjunction with an error-correcting syndrome register.

The following describes an apparatus for and method of correcting errors in a received signal comprised of a rate-one orthogonal convolutional code generated by an LFSR. The received signal is fed into a multiple-stage shift register. Estimates of one stage of the shift register are made based on the outputs of several of the other stages of the shift register. These estimates are combined on a bit-by-bit basis to provide a corrected received signal. The apparatus/method may be used in a synchronization detector, such as the one provided in U.S. Pat. No. 4,827,514, issued on May 2, 1989 to Ziolko et al., with the same assignee as the present invention, which patent is hereby incorporated by reference.

An apparatus for correcting errors in a rate-one orthogonal convolutional code, comprises a shift register having a plurality of stages. A multiplicity of estimators is coupled to at least some of the plurality of stages. The estimators provide a multiplicity of estimates of a received signal. A majority decoder is coupled to the multiplicity of linear estimators. The majority decoder is arranged and constructed to yield a corrected received signal from the multiplicity of estimates.

In one embodiment, the majority decoder is comprised of a majority circuit, coupled to the multiplicity of linear estimators, arranged and constructed to provide a corrective signal from the multiplicity of estimates and a combiner, coupled to the majority circuit, arranged and constructed to combine the corrective signal with at least one of the outputs of the plurality of stages of the shift register to yield a corrected received signal. In one embodiment, where there are M estimates, the majority circuit is comprised of a circuit, arranged and constructed to provide as an output: (a) a binary one as the corrective signal when greater than or equal to M/2+1 of the multiplicity of estimates are a binary one and (b) a binary zero as the corrective signal when less than M/2+1 of the multiplicity of estimates are a binary one; and the combiner is comprised of an exclusive OR gate, which has a first input coupled to the output of the majority circuit, a second input coupled to the at least one of the outputs of the plurality of stages of the shift register, and an output which provides the corrected received signal. In another embodiment, the majority circuit is comprised of a circuit, arranged and constructed to provide an output that selects: (a) a first switch position, which causes a switch to output a binary one as the corrected received signal when greater than or equal to M/2+1 of the multiplicity of estimates are a binary one; (b) a second switch position, which causes the switch to output the one of the outputs of the plurality of stages of the shift register as the corrected received signal when less than M/2+1 and greater than M/2−1 of the multiplicity of estimates are a binary one; and (c) a third switch position, which causes the switch to output a binary zero as the corrected received signal when less than or equal to M/2−1 of the multiplicity of estimates are a binary one; and the combiner is comprised of the switch, which has one of the outputs of the plurality of stages of the shift register as a first input, the corrective signal as a second input, and uses the corrective signal to control whether a binary one, a binary zero, or the one of the outputs of the plurality of stages of the shift register provides the corrected received signal as an output signal.

Alternatively, an apparatus for correcting errors in a rate-one orthogonal convolutional code, comprises a shift register having a plurality of stages, wherein the shift register is comprised of a first segment and a second segment, and wherein the first segment has an output. A multiplicity of estimators, coupled to at least some of the plurality of stages, provides a multiplicity of estimates of the output of the first segment of the shift register. A majority circuit, coupled to the multiplicity of linear estimators, is arranged and constructed to provide a corrective signal from the multiplicity of estimates. A combiner, coupled to the majority circuit, is arranged and constructed to combine the corrective signal with the output of the first segment of the shift register to yield a corrected received signal. In this embodiment, there are M estimates, and the majority circuit may be comprised of a circuit, arranged and constructed to provide as an output: (a) a binary one as the corrective signal when greater than or equal to M/2+1 of the multiplicity of estimates are a binary one; (b) a binary zero as the corrective signal when less than M/2+1 of the multiplicity of estimates are a binary one; and the combiner is comprised of an exclusive OR gate, which has a first input coupled to the output of the majority circuit, a second input coupled to the output of the first segment of the shift register, and an output which provides the corrected received signal as an output signal. The majority circuit may be comprised of a circuit, arranged and constructed to provide an output that selects: (a) a first switch position, which causes a switch to output a binary one as the corrected received signal when greater than or equal to M/2+1 of the multiplicity of estimates are a binary one; (b) a second switch position, which causes the switch to output the output of the first segment of the shift register as the corrected received signal when less than M/2+1 and greater than M/2−1 of the multiplicity of estimates are a binary one; (c) a third switch position, which causes the switch to output a binary zero as the corrected received signal when less than or equal to M/2−1 of the multiplicity of estimates are a binary one; and the combiner is comprised of the switch, which has the output of the first segment of the shift register as a first input, has the corrective signal as a second input, and uses the corrective signal to control whether a binary one, a binary zero, or the output of the first segment of the shift register provides the corrected received signal as an output signal. In the preferred embodiment of this alternative, the first segment contains uncorrected bits and the second segment contains corrected bits.

In the preferred embodiment, the shift register has 128 stages, and the multiplicity of estimators is comprised of seven linear estimators, each of which performs a different one of the following equations:

$$x^{64'} = x^{62} \oplus x^{46} \oplus x^{38} \oplus x^{27} \oplus x^{15} \oplus x^{0};$$

$$x^{64'} = x^{66} \oplus x^{48} \oplus x^{40} \oplus x^{29} \oplus x^{17} \oplus x^{2};$$

$$x^{64'} = x^{82} \oplus x^{80} \oplus x^{56} \oplus x^{45} \oplus x^{33} \oplus x^{18};$$

$$x^{64'} = x^{90} \oplus x^{88} \oplus x^{72} \oplus x^{53} \oplus x^{41} \oplus x^{26};$$

$$x^{64'} = x^{101} \oplus x^{99} \oplus x^{83} \oplus x^{75} \oplus x^{52} \oplus x^{37};$$

$$x^{64'} = x^{113} \oplus x^{111} \oplus x^{95} \oplus x^{87} \oplus x^{76} \oplus x^{49};$$

$$x^{64'} = x^{128} \oplus x^{126} \oplus x^{110} \oplus x^{102} \oplus x^{91} \oplus x^{79}.$$

Generally, the method comprises receiving a sisal generated by a linear feedback shift register. The received signal is fed into a shift register having a plurality of stages. A stage of the plurality of stages of the shift register is estimated, providing a multiplicity of estimate signals. The estimate signals are combined by a majority role so as to provide a corrective sisal. The corrective sisal is combined with the output of the stage of the plurality of stages of the shift register so as to provide a corrected received signal. In the preferred embodiment, the stage of the plurality of stages of the shift register is found approximately half-way through the plurality of stages, the second stage of the plurality of stages of the shift register is found immediately before the stage of the plurality of stages of the shift register. Particularly, the shift register is comprised of 128 stages ad the first stage of the plurality of stages of the shift register is the 64th stage of the shift register. Alternatively, the shift register may have two segments, a first segment and a second segment. The stage may be the last stage of the first segment, and the first segment contains uncorrected bits, and the second segment contains corrected bits.

Figure 2:
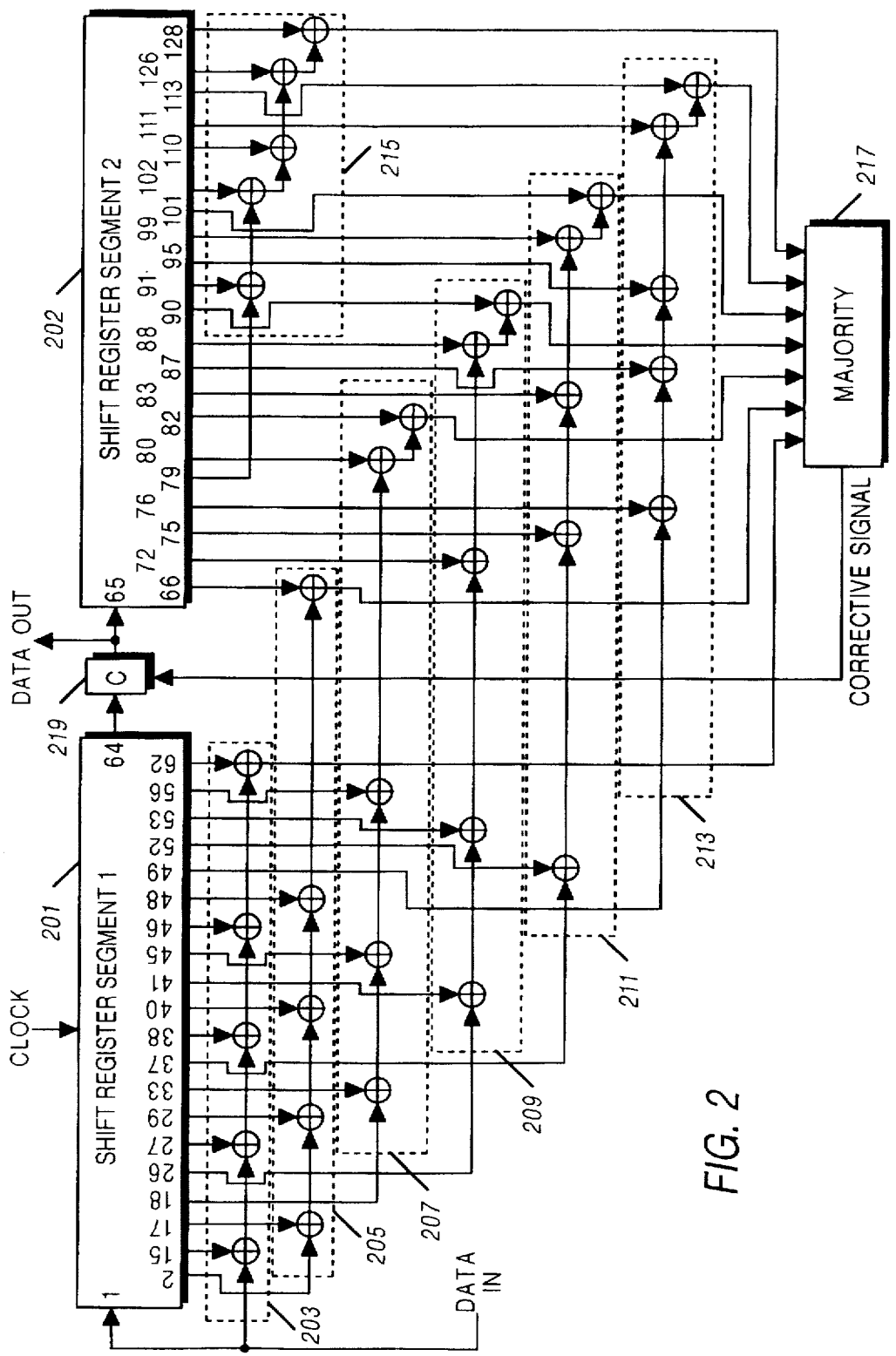
FIG. 2 is a block diagram of a shift register with multiple error estimators in accordance with the invention.

A shift register 201 and 202 containing 128 stages, is shown in FIG. 2. The shift register 201 and 202 is comprised of D flip-flops in cascade with the Q output of stage X being input to the D input of stage X+1, as is known in the art. In the preferred embodiment, the first segment 201 and the second segment 202 are each comprised of 64 stages, or 64 D flip-flops as previously described. The output of the last stage of the first segment 201, i.e., the output of the first segment 201, is $x^{64}$, which is estimated as $x^{64'}$ by the estimators described below. The numbers shown inside the shift register 201 and 202, such as 0, 2, 15, 17, and so forth, indicate the output of a particular stage of the shift register. The 0 stage represents the input bit to the shift register 201 and 202. DATA IN, a received digital signal comprised of binary bits, is input to the first segment 201 of the shift register 201 and 202. DATA IN is a stream of digital bits generated by a 64-bit LFSR with the feedback taps at stages 15, 27, 38, 46, 62, and 64. In the preferred embodiment, DATA IN is a stream of data comprised of the synchronization sequence and cipher text, which is encrypted digital data. The transmitting LFSR creates what is known as a rate-one orthogonal convolutional code. Each of the multiplicity of estimators 203, 205, 207, 209, 211, 213, and 215 are used to separately but substantially simultaneously (within one clock cycle) estimate the 64th bit of the shift register, i.e., the output of the first segment 201 of the shift register 201 and 202. In the preferred embodiment of FIG. 2, a 128-bit shift register is used, and the 64th bit is estimated.

Each of these estimators includes five XOR gates which perform modulo two addition on six of the taps or stages from the shift register. The output of each of the estimators is input to majority decoder 217. In the preferred embodiment of the present invention, seven estimators are used. The equations for the seven estimations are as follows.

The first estimator 203 uses the equation $$x^{64'} = x^{62} \oplus x^{46} \oplus x^{38} \oplus x^{27} \oplus x^{15} \oplus x^{0}.$$

The second estimator 205 uses the equation $$x^{64'} = x^{66} \oplus x^{48} \oplus x^{40} \oplus x^{29} \oplus x^{17} \oplus x^{2}.$$

The third estimator 207 uses the equation $$x^{64'} = x^{82} \oplus x^{80} \oplus x^{56} \oplus x^{45} \oplus x^{33} \oplus x^{18}.$$

The fourth estimator 209 uses the equation $$x^{64'} = x^{90} \oplus x^{88} \oplus x^{72} \oplus x^{53} \oplus x^{41} \oplus x^{26}.$$

The fifth estimator 211 uses the equation $$x^{64'} = x^{101} \oplus x^{99} \oplus x^{83} \oplus x^{75} \oplus x^{52} \oplus x^{37}.$$

The sixth estimator 213 uses the equation $$x^{64'} = x^{113} \oplus x^{111} \oplus x^{95} \oplus x^{87} \oplus x^{76} \oplus x^{49}.$$

The seventh estimator 215 uses the equation $$x^{64'} = x^{128} \oplus x^{126} \oplus x^{110} \oplus x^{102} \oplus x^{91} \oplus x^{79}.$$

In each of the equations, the $\oplus$ designation denotes modulo two addition as is provided by the exclusive OR binary function, also referred to as XOR, as is known in the art. The exclusive OR function operates as follows, where 0 and 1 are binary numbers: $0 \oplus 0 = 0$; $0 \oplus 1 = 1$; $1 \oplus 0 = 1$; and $1 \oplus 1 = 0$. Another way of viewing the XOR function is $A \oplus 0 = A$ and $A \oplus 1 = A'$, where ' designates the binary opposite (i.e., $1 = 0$ and $0' = 1$). $x^{64'}$ refers to an estimate of the output of the 64th stage of the shift register 201. $x^{62}$ refers to the output of the 62nd stage. $x^{101}$ refers to the output of the 101st stage, and so forth. $x^0$ refers to the output of the 0th stage, which is the input (DATA IN) to the first segment 201 of the shift register 201 and 202.

Each of the seven estimators 203, 205, 207, 209, 211, 213, and 215 exclusive ORs six different stages or taps from the shift register 201. Each time a clock pulse enters the shift register, the estimators 203, 205, 207, 209, 211, 213, and 215 perform an estimation of the 64th stage of the shift register 201 and 202. Because the output of the 64th stage of the shift register 201 and 202 is a binary bit, 0 or 1, the output of each of the estimators is also a binary bit, 0 or 1. Thus, the seven estimates of $x^{64}$ are 7 binary bits. Although the shift register 201 and 202 in the preferred embodiment contains 128 bits and seven estimators are used in the preferred embodiment, those of skill in the art will readily recognize that the present invention will be successfully implemented with a shift register of longer or shorter length, and with fewer or a greater number of estimators.

The outputs from each of the estimators 203, 205, 207, 209, 211, 213, and 215 are input to a majority circuit 217. The majority circuit 217 takes the output signals from the seven estimators and creates a corrective signal from the estimates of the output of the 64th bit of the shift register 201 and 202. Because each of the estimators estimates the 64th bit of the shift register 201 and 202, the output of the majority circuit 217 is a corrective signal for $x^{64}$. The corrective signal is input to a combiner 219, which combines the corrective signal with the output of the 64th bit of the first segment 201 of the shift register 201 and 202. The output of the combiner 219 is the DATA OUT signal of the shift register 201 and 202, which signal is the corrected received signal or a corrected version of the DATA IN signal. In the preferred embodiment, the output of the combiner 219 is input to the second segment 202 of the shift register 201 and 202. Thus, all estimators using taps from the second segment 202 of the shift register 201 and 202 use corrected data to make their estimates, thereby yielding more accurate estimates of $x^{64}$.

Block diagrams of alternate embodiments of a majority decoder, comprised of the majority circuit 217 and the combiner 219, are shown in FIG. 3-1 and FIG. 3-2. The first way of providing the majority output is shown in FIG. 3-1. Each of the estimates of $x^{64}$ from the estimators 203, 205, 207, 209, 211, 213, and 215 are input to the majority circuit 217. In the preferred embodiment, there are 7 estimates, and these estimates consist of seven binary bits, 0s and/or 1s. The majority circuit 217 counts how many binary 1s are received. Throughout the text, M denotes how many estimates of $x^{64}$, i.e., estimators, are used. In the preferred embodiment, M is 7. If $M/2+1$ or more of the estimates are binary 1s, then a binary one is output as a corrective signal by the majority circuit 217 to the combiner 219, which is an XOR gate 219. If less than $M/2+1$ of the estimates are binary 1s, then the majority circuit 217 outputs as the corrective signal a binary zero to the XOR gate 219. The other input to the XOR gate 219 is bit 64 or the output of the 64th stage of the shift register 201 and 202. The output of the XOR gate 219 is $x^{64}$ corrected, and is the DATA OUT signal (the output) of the shift register 201 and 202.

An alternative apparatus or method for determining the majority output of the majority decoder is shown in FIG. 3-2. Majority circuit 217 counts how many binary 1s it receives from the seven estimators 203, 205, 207, 209, 211, 213, and 215 of $x^{64}$. If the number of binary 1s is greater than or equal to $M/2+1$, then the combiner 219, which is a switch 219, is placed in the down position, and a binary one is the corrected received signal for this bit. If less than $M/2+1$ but greater than $M-(M/2+1)=M/2-1$ of the seven estimates are binary 1s, the switch 219 is placed in the middle position, and the corrected received signal is equal to bit 64 or the output of the 64th stage of the shift register 201 and 202. If less than or equal to $M/2-1$ of the seven estimates are a binary 1, the switch 219 is placed in the up position, and the corrected received signal is equal to a binary zero.

Because the multiple estimates of $x^{64}$ are performed in parallel, i.e., within the same clock cycle, each time a new clock pulse enters the shift register 201, a corrected data bit is output from the shift register 201 when a new clock pulse enters the shift register 201. In other words, as information is clocked through the shift register, an estimate of the 64th bit of the shift register 201 is provided during each clock cycle, thereby providing a continuous stream of corrected data. This method eliminates the need for the temporary register 113 that holds corrected bits since the corrected bits are stored in the last 64 bits of the shift register 201 and 202.

A flow chart showing error correction of an LFSR sequence is shown in FIG. 4. At step 401, a signal is received, which signal contains an LFSR sequence. The received signal is fed into the shift register 201 at step 403. At step 405, estimate signals are created based on the received signal and are provided to the majority decoder 217 and 219. At step 407, the estimate signals, as provided in step 405, are combined by majority rule yielding a corrective signal at step 407. At step 409, the corrective signal from step 407 is combined with the output of one of the stages of the shift register 201 to provide a corrected received signal. In the preferred embodiment, there are seven estimate signals, as described above, and the corrective signal is combined with the output of the 64th stage of the shift register 201 and 202 to provide the corrected output of the 64th stage of the shift register 201 and 202, which is the corrected received signal that is output by the shift register 201 and 202 and is used as the input to the second segment 202 of the shift register.

The flow chart of FIG. 5-1 shows one method of combining a corrected signal with a stage of the shift register 201 to provide a corrected received signal as shown in steps 407 and 409 of FIG. 4. At step 501, it is determined how many binary ones are received from the estimators 203, 205, 207, 209, 211, 213, and 215 that provide the estimate signals in step 405. If there are greater than or equal to M/2+1 binary ones at step 501, the process continues with step 503, where corrected bit 64 is a binary one XORed with bit 64, i.e., the output of the 64th stage of the shift register 201 and 202. If at step 501 there are less than M/2+1 binary ones from the estimate signals provided in step 405, the process continues with step 505, where corrected bit 64 is a binary zero XORed with bit 64 of the shift register 201 and 202.

An alternative method for combining a corrected signal with the shift register to provide corrected received signals as in step 409 is shown in FIG. 5-2. This flow chart may be performed by the apparatus as shown in FIG. 3-2. At step 511, it is determined how many binary ones are received from the estimators 203, 205, 207, 209, 211, 213, and 215 that provide the estimate signals in step 405. In the preferred embodiment, the estimate signals are the results of the seven equations described above with respect to FIG. 2. If there are greater than or equal to M/2+1 binary ones at step 511, the process continues with step 513, where a binary one is output as the corrected 64th bit of the shift register 201 and 202. If there are less than or equal to M/2−1 binary ones in step 511, the process continues with step 515 where a binary zero is output as the corrected 64th bit of the shift register 201. If at step 511 there are less than M/2+1 and greater than M/2−1 binary ones in the estimate signals, the process continues with step 517, where the output of stage 64 or the 64th bit is output as the corrected 64th bit at step 517, and the process ends.

Figure 6:
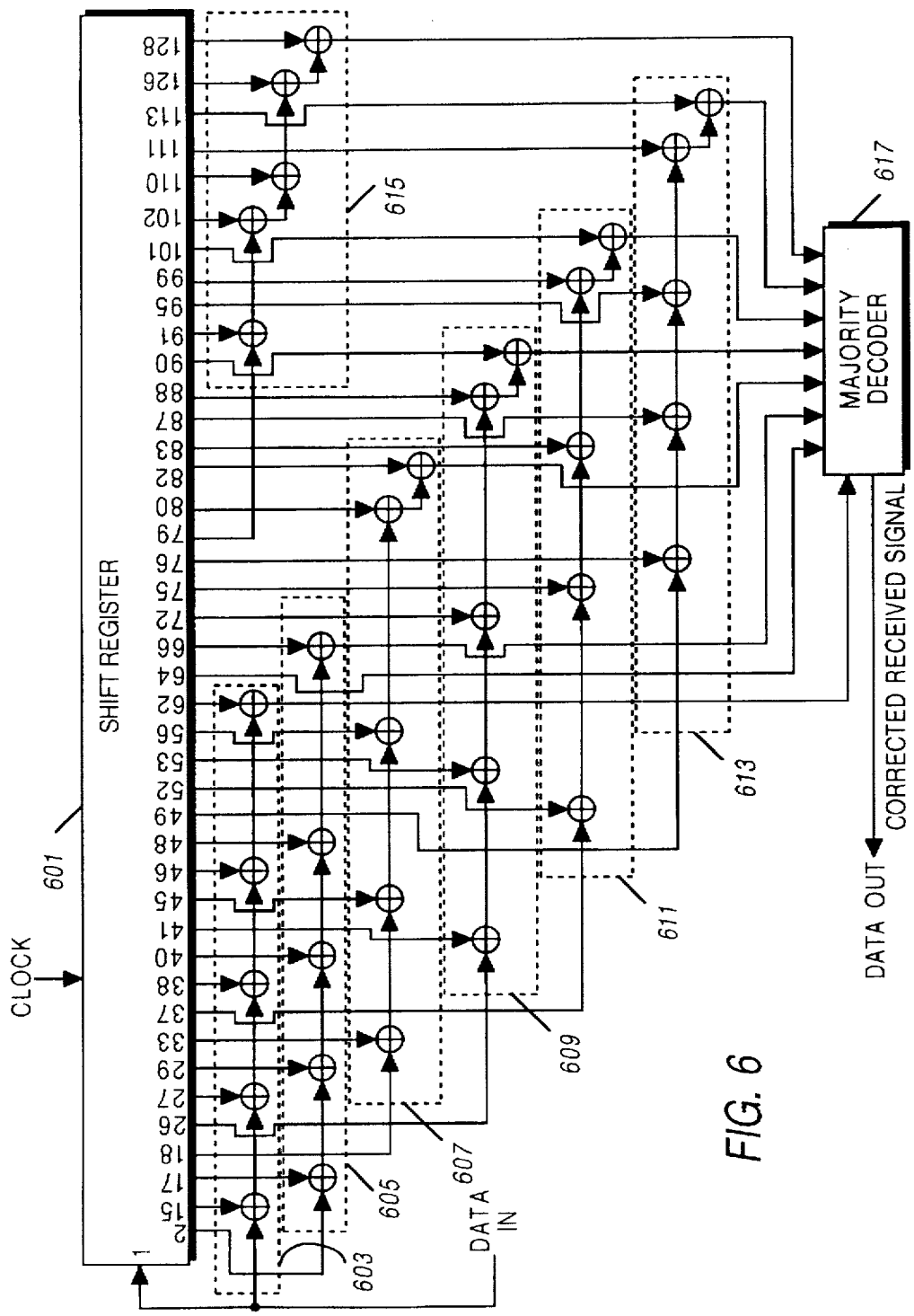
FIG. 6 is a block diagram of an alternate combination of shift register and multiple error estimators in accordance with the invention.

A block diagram of an alternate combination of shift register and multiple error estimators is shown in FIG. 6. The elements of FIG. 6 perform the same functions as the similar components of FIG. 2, with the following exceptions. The shift register 601 is not broken into two segments, and hence is comprised of 128 stages of D flip-flops in cascade. The majority decoder 617 is comprised of both the majority block 217 and combiner 219 of either FIG. 3-1 or FIG. 3-2. The output of the 64th stage of the shift register 601 is input to the majority decoder 617. The output of the majority decoder 617 is corrected bit 64, which is taken as the (corrected) output of the shift register 601. In FIG. 6, the corrected data is not fed back into the shift register 601, as corrected data was fed back into the shift register 201 and 202 in FIG. 2. Thus, the corrected data out of the shift register 601 in FIG. 6 is not as accurate as the corrected data out of the shift register 201 and 202 in FIG. 2. Less accurate correction may also be obtained by using fewer estimators 603, 605, 607, 609, 611, 613, and 615. More than seven estimators may also be used.

The above describes a method and apparatus for a particular polynomial equation, $x^{64} \oplus x^{62} \oplus x^{46} \oplus x^{38} \oplus x^{27} \oplus x^{15} \oplus x^0$, that is implemented at the transmitter. One of average skill in the art would be able to implement the above invention for a different polynomial, including polynomials with a different number of taps and a different number of stages, without difficulty, based on the above teachings.

In the preferred embodiment of the present invention, the apparatus of FIG. 2 and FIG. 6, in accordance with the flowchart of FIG. 4, is implemented in a 68HC11 microprocessor, available from Motorola, Inc. One of skill in the art could easily implement the present invention in discrete circuit elements, a custom integrated circuit, an applications specific integrated circuit, or other known instruments for implementing digital logic.

This invention allows for the efficient implementation of an apparatus for and method of correcting errors in a received signal comprised of a rate-one orthogonal convolution code generated by an Linear Feedback Shift Register (LFSR) in an 8-bit microprocessor. This is accomplished by reducing the microprocessor RAM storage requirements to implement the shift registers. In the preferred embodiment, the temporary register shown in FIG. 1 is not required. In addition, the XOR functions are part of the microprocessor CPU (central processing unit) and does not require dedicated hardware to implement. This implementation allows the processor to be implemented in a parallel function, where 8 bits can be corrected simultaneously.

What is claimed is:

1. An apparatus for correcting errors in a rate-one orthogonal convolutional code, comprising:

a shift register having a plurality of stages;

a multiplicity of estimators, coupled to at least some of the plurality of stages, providing a multiplicity of estimates of a received signal;

a majority decoder, coupled to the multiplicity of estimators, arranged and constructed to yield a corrected received signal from the multiplicity of estimates.

2. The apparatus of claim 1, wherein the majority decoder is comprised of:

a majority circuit, coupled to the multiplicity of estimators, arranged and constructed to provide a corrective signal from the multiplicity of estimates;

a combiner, coupled to the majority circuit, arranged and constructed to combine the corrective signal with at least one of the outputs of the plurality of stages of the shift register to yield a corrected received signal.

3. The apparatus of claim 2, where M is the number of estimates, and wherein the majority circuit is comprised of a circuit, arranged and constructed to provide as an output:

(a) a binary one as the corrective signal when greater than or equal to M/2+1 of the multiplicity of estimates are a binary one;

(b) a binary zero as the corrective signal when less than M/2+1 of the multiplicity of estimates are a binary one; and the combiner is comprised of an exclusive OR gate, which has a first input coupled to the output of the majority circuit, a second input coupled to the at least one of the outputs of the plurality of stages of the shift register, and an output which provides the corrected received signal.

4. The apparatus of claim 2, where M is the number of estimates, and wherein the majority circuit is comprised of a circuit, arranged and constructed to provide an output that selects:

(a) a first switch position, which causes a switch to output a binary one as the corrected received signal when greater than or equal to M/2+1 of the multiplicity of estimates are a binary one;

(b) a second switch position, which causes the switch to output the one of the outputs of the plurality of stages of the shift register as the corrected received signal when less than M/2+1 and greater than M/2−1 of the multiplicity of estimates are a binary one;

(c) a third switch position, which causes the switch to output a binary zero as the corrected received signal when less than or equal to M/2−1 of the multiplicity of estimates are a binary one; and the combiner is comprised of the switch, which has one of the outputs of the plurality of stages of the shift register as a first input, the corrective signal as a second input, and uses the corrective signal to control whether a binary one, a binary zero, or the one of the outputs of the plurality of stages of the shift register provides the corrected received signal as an output signal.

5. The apparatus of claim 1, wherein the shift register has 128 stages, and wherein the multiplicity of estimators is comprised of seven linear estimators, each of which performs a different one of the following equations:

$$x^{64'}=x^{62}\oplus x^{46}\oplus x^{38}\oplus x^{27}\oplus x^{15}\oplus x^{0};$$
$$x^{64'}=x^{66}\oplus x^{48}\oplus x^{40}\oplus x^{29}\oplus x^{17}\oplus x^{2};$$
$$x^{64'}=x^{82}\oplus x^{80}\oplus x^{56}\oplus x^{45}\oplus x^{33}\oplus x^{18};$$
$$x^{64'}=x^{90}\oplus x^{88}\oplus x^{72}\oplus x^{53}\oplus x^{41}\oplus x^{26};$$
$$x^{64'}=x^{101}\oplus x^{99}\oplus x^{83}\oplus x^{75}\oplus x^{52}\oplus x^{37};$$
$$x^{64'}=x^{113}\oplus x^{111}\oplus x^{95}\oplus x^{87}\oplus x^{76}\oplus x^{49};$$

and $$x^{64'}=x^{128}\oplus x^{126}\oplus x^{110}\oplus x^{102}\oplus x^{91}\oplus x^{79}.$$

6. A method comprising the steps of:

receiving a signal generated by a linear feedback shift register;

continuously feeding the received signal into a shift register having a plurality of stages;

continuously estimating an output of a stage of the plurality of stages of the shift register, providing a multiplicity of estimate signals;

continuously combining the estimate signals by a majority rule so as to provide a corrective signal;

continuously combining the corrective signal with the output of the stage of the plurality of stages of the shift register so as to provide a corrected received signal.

7. The method of claim 6, wherein the stage of the plurality of stages of the shift register is found approximately half-way through the plurality of stages.

8. The method of claim 6, wherein the shift register has two segments, a first segment and a second segment, and the stage is the last stage of the first segment.

9. The method of claim 8, wherein the first segment contains uncorrected bits and the second segment contains corrected bits.

10. The method of claim 6, wherein the shift register is comprised of 128 stages and the stage of the plurality of stages of the shift register is the 64th stage of the shift register.

11. The method of claim 10, wherein the estimating step further comprises the step of calculating the following equations, the results of which equations provide the multiplicity of estimate signals:

$$x^{64'}=x^{62}\oplus x^{46}\oplus x^{38}\oplus x^{27}\oplus x^{15}\oplus x^{0};$$
$$x^{64'}=x^{66}\oplus x^{48}\oplus x^{40}\oplus x^{29}\oplus x^{17}\oplus x^{2};$$
$$x^{64'}=x^{82}\oplus x^{80}\oplus x^{56}\oplus x^{45}\oplus x^{33}\oplus x^{18};$$
$$x^{64'}=x^{90}\oplus x^{88}\oplus x^{72}\oplus x^{53}\oplus x^{41}\oplus x^{26};$$
$$x^{64'}=x^{101}\oplus x^{99}\oplus x^{83}\oplus x^{75}\oplus x^{52}\oplus x^{37};$$
$$x^{64'}=x^{113}\oplus x^{111}\oplus x^{95}\oplus x^{87}\oplus x^{76}\oplus x^{49};$$

and $$x^{64'}=x^{128}\oplus x^{126}\oplus x^{110}\oplus x^{102}\oplus x^{91}\oplus x^{79}$$

where $x^{64'}$ is an estimate of the 64th stage of the shift register.

12. An apparatus for correcting errors in a rate-one orthogonal convolutional code, comprising:

a shift register having a plurality of stages, wherein the shift register is comprised of a first segment and a second segment, wherein the first segment has an output;

a multiplicity of estimators, coupled to at least some of the plurality of stages, providing a multiplicity of estimates of the output of the first segment of the shift register;

a majority circuit, coupled to the multiplicity of estimators, arranged and constructed to provide a corrective signal from the multiplicity of estimates;

a combiner, coupled to the majority circuit, arranged and constructed to combine the corrective signal with the output of the first segment of the shift register to yield a corrected received signal.

13. The apparatus of claim 12, where M is the number of estimates, and wherein the majority circuit is comprised of a circuit, arranged and constructed to provide as an output:

(a) a binary one as the corrective signal when greater than or equal to M/2+1 of the multiplicity of estimates are a binary one;

(b) a binary zero as the corrective signal when less than M/2+1 of the multiplicity of estimates are a binary one; and the combiner is comprised of an exclusive OR gate, which has a first input coupled to the output of the majority circuit, a second input coupled to the output of the first segment of the shift register, and an output which provides the corrected received signal as an output signal.

14. The apparatus of claim 12, where M is the number of estimates, and wherein the majority circuit is comprised of a circuit, arranged and constructed to provide an output that selects:

(a) a first switch position, which causes a switch to output a binary one as the corrected received signal when greater than or equal to M/2+1 of the multiplicity of estimates are a binary one;

(b) a second switch position, which causes the switch to output the output of the first segment of the shift register as the corrected received signal when less than M/2+1 and greater than M/2−1 of the multiplicity of estimates are a binary one;

(c) a third switch position, which causes the switch to output a binary zero as the corrected received signal when less than or equal to M/2−1 of the multiplicity of estimates are a binary one; and the combiner is comprised of the switch, which has the output of the first segment of the shift register as a first input, has the corrective signal as a second input, and uses the corrective signal to control whether a binary one, a binary zero, or the output of the first segment of the shift register provides the corrected received signal as an output signal.

15. The apparatus of claim 12, wherein the shift register has 128 stages, and wherein the multiplicity of estimators is comprised of seven linear estimators, each of which performs a different one of the following equations:

$$x^{64'} = x^{62} \oplus x^{46} \oplus x^{38} \oplus x^{27} \oplus x^{15} \oplus x^{0};$$

$$x^{64'} = x^{66} \oplus x^{48} \oplus x^{40} \oplus x^{29} \oplus x^{17} \oplus x^{2};$$

$$x^{64'} = x^{82} \oplus x^{80} \oplus x^{56} \oplus x^{45} \oplus x^{33} \oplus x^{18};$$

$$x^{64'} = x^{90} \oplus x^{88} \oplus x^{72} \oplus x^{53} \oplus x^{41} \oplus x^{26};$$

$$x^{64'} = x^{101} \oplus x^{99} \oplus x^{83} \oplus x^{75} \oplus x^{52} \oplus x^{37};$$

$$x^{64'} = x^{113} \oplus x^{111} \oplus x^{95} \oplus x^{87} \oplus x^{76} \oplus x^{49};$$

and $$x^{64'} = x^{128} \oplus x^{126} \oplus x^{110} \oplus x^{102} \oplus x^{91} \oplus x^{79}.$$

16. The apparatus of claim 12, wherein the first segment contains uncorrected bits and the second segment contains corrected bits.

17. A method comprising the steps of:

receiving a signal generated by a linear feedback shift register, wherein the signal is comprised of a rate-one orthogonal convolutional code;

feeding the received signal into a shift register having a plurality of stages;

estimating an output of a stage of the plurality of stages of the shift register, providing a multiplicity of estimate signals;

combining the estimate signals by a majority rule so as to provide a corrective signal;

combining the corrective signal with the output of the stage of the plurality of stages of the shift register so as to provide a corrected received signal.

18. The method of claim 17, wherein the stage of the plurality of stages of the shift register is found approximately half-way through the plurality of stages.

19. The method of claim 17, wherein the shift register has two segments, a first segment and a second segment, and the stage is the last stage of the first segment, and wherein the first segment contains uncorrected bits and the second segment contains corrected bits.

20. The method of claim 17, wherein the shift register is comprised of 128 stages and the stage of the plurality of stages of the shift register is the 64th stage of the shift register, and wherein the estimating step further comprises the step of calculating the following equations, the results of which equations provide the multiplicity of estimate signals:

$$x^{64'} = x^{62} \oplus x^{46} \oplus x^{38} \oplus x^{27} \oplus x^{15} \oplus x^{0};$$

$$x^{64'} = x^{66} \oplus x^{48} \oplus x^{40} \oplus x^{29} \oplus x^{17} \oplus x^{2};$$

$$x^{64'} = x^{82} \oplus x^{80} \oplus x^{56} \oplus x^{45} \oplus x^{33} \oplus x^{18};$$

$$x^{64'} = x^{90} \oplus x^{88} \oplus x^{72} \oplus x^{53} \oplus x^{41} \oplus x^{26};$$

$$x^{64'} = x^{101} \oplus x^{99} \oplus x^{83} \oplus x^{75} \oplus x^{52} \oplus x^{49};$$

$$x^{64'} = x^{113} \oplus x^{111} \oplus x^{95} \oplus x^{87} \oplus x^{76} \oplus x^{49};$$

and $$x^{64'} = x^{128} \oplus x^{126} \oplus x^{110} \oplus x^{102} \oplus x^{91} \oplus x^{79}$$

where $x^{64'}$ is an estimate of the 64th stage of the shift register.

* * * * *

UNITED STATES PATENT AND TRADEMARK OFFICE
CERTIFICATE OF CORRECTION

PATENT NO. : 5,729,559
DATED : March 17, 1998
INVENTOR(S) : Bright et al.

It is certified that error appears in the above-indentified patent and that said Letters Patent is hereby corrected as shown below:

Column 12, line 37 reads "$\oplus\ x^{52} \oplus x^{49}$" should be --"$\oplus\ x^{52} \oplus x^{37}$--.

Signed and Sealed this

Eighteenth Day of August, 1998

Attest:

BRUCE LEHMAN

*Attesting Officer*     *Commissioner of Patents and Trademarks*